US008883380B2

(12) United States Patent
Arai et al.

(10) Patent No.: US 8,883,380 B2
(45) Date of Patent: *Nov. 11, 2014

(54) FILM EXPOSURE METHOD

(75) Inventors: Toshinari Arai, Yokohama (JP); Kazushige Hashimoto, Yokohama (JP)

(73) Assignee: V Technology Co., Ltd., Yokohama-Shi, Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/884,192

(22) PCT Filed: Oct. 24, 2011

(86) PCT No.: PCT/JP2011/074455
§ 371 (c)(1),
(2), (4) Date: May 8, 2013

(87) PCT Pub. No.: WO2012/063632
PCT Pub. Date: May 18, 2012

(65) Prior Publication Data
US 2013/0230799 A1    Sep. 5, 2013

(30) Foreign Application Priority Data

Nov. 10, 2010   (JP) ................................. 2010-252206

(51) Int. Cl.
*G03F 7/20*       (2006.01)
*G03F 9/00*       (2006.01)
*G03B 27/10*     (2006.01)

(52) U.S. Cl.
CPC .. *G03F 7/20* (2013.01); *G03F 9/00* (2013.01); *G03F 7/70791* (2013.01); *G03B 27/10* (2013.01); *Y10S 430/146* (2013.01)
USPC ................. 430/22; 430/30; 430/292; 430/945

(58) Field of Classification Search
USPC ........................................ 430/22, 30, 292, 945
See application file for complete search history.

(56) References Cited

U.S. PATENT DOCUMENTS

| 2003/0190071 | A1 | 10/2003 | Ganot et al. |
| 2005/0225788 | A1 | 10/2005 | Katayama et al. |
| 2013/0235362 | A1* | 9/2013 | Kanao ............................ 355/67 |

FOREIGN PATENT DOCUMENTS

| JP | 62-294252 A | 12/1987 |
| JP | 01-295261 A | 11/1989 |
| JP | 2001-060008 A | 3/2001 |
| JP | 2004-523101 A | 7/2004 |
| JP | 2005-283896 A | 10/2005 |
| JP | 2005-316411 A | 11/2005 |
| JP | 2006-235533 A | 9/2006 |
| JP | 2006-292919 A | 10/2006 |
| JP | 2007-310209 A | 11/2007 |
| WO | WO 2008/139643 A1 | 11/2008 |

OTHER PUBLICATIONS

International Search Report in PCT/JP2011/074455 dated Nov. 22, 2011(English Translation Thereof).

* cited by examiner

*Primary Examiner* — Christopher Young
(74) *Attorney, Agent, or Firm* — McGinn IP Law Group, PLLC

(57) ABSTRACT

On a film where an exposure material coating has been formed in a exposure pattern formation region on a film base material, a colored firing material, colored light-curable material, or colored ink is applied to at least one of two widthwise side edges to form a side part application coating, which is irradiated with laser light by an alignment mark formation unit to form an alignment mark. The alignment mark is then used to detect film meandering and adjust the positions of masks. This makes it easy to form the alignment mark and detect the alignment mark thus formed and makes it possible to accurately correct for meandering of a film and stably expose the film in the process of continuous exposure of a film where an exposure material coating has been formed in a exposure pattern formation region on a film base material.

4 Claims, 10 Drawing Sheets

FILM EXPOSURE METHOD

TECHNICAL FIELD

The present invention relates to a film exposure method; and in particular relates to a film exposure method in which, when a film having an exposure material film formed on an exposure-pattern-forming region of a film base material is to be continuously exposed, meandering of the film can be accurately corrected and the film can be stably exposed.

BACKGROUND ART

Conventionally, when a plate-shaped substrate or other member is to be exposed, accurately managing the exposure position thereof has been achieved by, e.g., using a substrate having a predetermined marking applied to its surface, and using the marking to determine the position of an exposure mask (e.g., Patent Documents 1 to 3), or installing a registration pin on a pallet on which the substrate is placed (e.g., Patent Document 4).

However, in a case where a film is to be exposed and the film is continuously supplied into an exposure apparatus, as in a roll-to-roll format, then it is difficult to apply the above registration technique used when exposing a plate-shaped member. That is, on a roll-to-roll film production line, the film to be exposed is supplied into an exposure apparatus 1 in, for example, a step as is illustrated in FIG. 9, and unlike when a plate-shaped substrate or the like is being exposed, the film 2 being conveyed is more likely to undulate due to its flexibility.

Furthermore, on the roll-to-roll film production line illustrated in FIG. 9, a treatment that makes use of the flexibility of the film is carried out at all processing steps. That is, a film 2 is unwound from a supply reel 80, supplied to the line, and dry cleaned, surface-modified, or otherwise pretreated in a pretreatment unit 3. A predetermined exposure material is applied to the surface with a slit coater 4, and the applied exposure material is dried in a drying apparatus 5. The film 2, with an exposure material coating formed on its surface, is supplied to the exposure apparatus 1, and the exposure material coating is exposed using the exposure apparatus 1. During this time, the film 2 is supported by, for example, rollers 9 between each of the apparatuses, and is conveyed by the rotation thereof. Accordingly, it is difficult to apply the techniques disclosed in Patent Documents 1 to 4 for the exposure of the film 2 in a roll-to-roll format.

In a case where a film is being exposed in a roll-to-roll format, it is very important to maintain a relative positional relationship between the film and the mask, in order to heighten the exposure accuracy. For example, Patent Document 5 discloses a technique for positioning a mask with respect to a film. Namely, the technique disclosed in Patent Document 5, in which case one sheet of film undergoes two separate cycles of exposure, is adapted for subjecting the film to a first cycle of exposure to form a pattern and thereafter, in the second cycle of exposure, adjusting the position of the mask by using a line charge-coupled device (CCD) to detect the pattern formed by the first cycle of exposure. As in FIG. 2 of Patent Document 5, two side edges of the film in the width direction are not part of the exposure region.

FIG. 10 illustrates by way of example a conventional exposure apparatus of a model where exposure light sources 11 for emitting an exposure light are arranged face-to-face so that one pair corresponds to one mask 12, and irradiate the exposure light from mutually different directions. An exposure apparatus of such a model has been used to expose an oriented material coating in the formation of, for example, a colorless, translucent oriented coating on a glass substrate such as a liquid crystal display or on a film base material such as a polarizing film. Namely, one practice in a case where an oriented coating is formed by exposure using the exposure apparatus is to supply into the exposure apparatus a member to be exposed having a colorless, translucent oriented material coating formed on the surface, and irradiating same with an exposure light from different directions in equal intervals of a predetermined region to form an oriented coating that has been oriented in different directions. According to the exposure apparatus of such description, it would be possible to, for example, segment a region of the film corresponding to one picture element into two in the width direction thereof, or to respectively segment the film in the width direction thereof into regions corresponding to one pixel, and form an oriented coating with different orientation directions respectively in each of the segmented regions. This feature of the orientation direction of the oriented coating causes the liquid crystal molecules sandwiched between glass substrates to behave differently when a voltage is applied, depending on the orientation direction of the oriented coating, and this makes it possible to broaden the angle of view of a display apparatus while also enabling the resulting film to be used as a polarizing film for a three-dimensional (3D) display or the like. Of late, there has been growing focus on such techniques of film exposure.

When a film is exposed using such an exposure apparatus, the film is susceptible to undulating while being conveyed, causing deviation in the exposure position. In order to reduce the impact of this deviation in exposure position, one practice of exposure with, for example, an exposure apparatus where a plurality of light sources is arranged side by side in the direction of movement of the film as described above has been to use a plurality of masks 12 and not just one mask, as illustrated in, for example, FIGS. 10 and 11, where each of the masks 12 is arranged in a staggered fashion so as to be side by side in the direction of movement of the member to be exposed and the width direction perpendicular thereto, and a exposure light source 11 is provided for each of the masks. The exposure light from the exposure light sources 11 is then transmitted through masks 121 to 124 and, as illustrated in FIG. 11, on an upstream side from which the film is being supplied, the film 2 is exposed at exposure regions A and C by the masks 121 and 122, which are arranged spaced apart from each other, while on the downstream side a region B between the exposure regions A and C is exposed by the mask 123 and a region D adjacent to the exposure region C is exposed by the mask 124. This makes it possible to accurately form a pattern of segmented orientation on substantially the full surface of the film 2.

PRIOR ART DOCUMENTS

Patent Documents

Patent Document 1: Japanese Patent Application Kokai Publication No. 62-294252
Patent Document 2: Japanese Patent Application Kokai Publication No. 2005-283896
Patent Document 3: Japanese Patent Application Kokai Publication No. 2005-316411
Patent Document 4: International Patent Application Publication No. 08/139,643
Patent Document 5: Japanese Patent Application Kokai Publication No. 2006-292919

DISCLOSURE OF THE INVENTION

Problems the Invention is Intended to Solve

However, the following problems have emerged in the prior art described above. Namely, the technique disclosed in Patent Document 5 requires that two separate cycles of an exposure operation be carried out for one sheet of film, and has very poor productivity.

In the case of a conventional exposure apparatus in which a plurality of the masks 12 is arranged and the exposure light sources 11 are provided so that there is one pair for each of the masks 12, then a portion into which the exposure light sources 11 are built, as illustrated in FIG. 10 (a chassis portion for the exposure light sources 11) has, for example, a length of about 2 m in the direction of movement of the film for one light source, and the distance between the exposure regions A and C and the exposure regions B and D as illustrated in FIG. 11 is longer, at about at least 4 m. A problem accordingly emerges in that, when conveyed from the exposure regions A and C on the upstream side toward the exposure regions B and D on the downstream side, the film is likely to undulate and deviate in the width direction perpendicular to the movement direction thereof. As such, at an exposure region on the downstream side in the direction of movement of the film, a problem emerges in that the positional deviation of the film in the width direction results in exposure of a region that has already been exposed, as well as in the occurrence of an unexposed region.

To resolve the problems, the applicant proposed in Japanese Patent Application No. 2010-089608 a conventional technique for forming an alignment mark at a side part on a film base material which is used, for example, as a region for film feeding and onto which an exposure material has not been applied, detecting using a CCD camera the deviation of the alignment mark in the width direction of the film on the downstream side in the direction of movement of the film, and adjusting in the width direction of the film the positions of masks 123 and 124 on the downstream side on the basis of the detection signal to correct for deviation of an exposure region.

One conceivable method for forming an alignment mark on an edge of a film would be either to mechanically bore a hole into the film or to carry out marking by laser or the like; however, but mechanical marking is not suitable for practical use because during this machining a vibration is applied to the film and the machining accuracy is reduced. Also, the film base material to be marked is colorless and translucent, and laser light is easily transmitted through the film in marking by laser or the like. Accordingly, in a case where, for example, ultraviolet light of a wavelength of 266 nm is used for marking, a problem emerges in that it is difficult to form an alignment mark without as much as, for example, 8 J/cm² for the irradiation energy of the laser light, which is extremely high.

The present invention has been contrived in view of the foregoing problems, it being an objective thereof to provide a film exposure method by which it is easy to form an alignment mark and to detect the alignment mark thus formed, and which makes it possible to accurately correct for meandering of a film and to stably expose the film, in the continuous exposure of a film obtained when an exposure material coating is formed in a exposure pattern formation region on a film base material.

Means for Solving the Problems

In a film exposure method of the present invention, an exposure material coating, which is formed in an exposure pattern formation region on a film base material of a film, is irradiated with an exposure light via a mask, whereby a pattern of the mask is exposed on the exposure material coating, the method comprising:

supplying a film where a colored firing material, a colored light-curable material, or a colored ink has been applied to at least one of two widthwise side edges of the film base material to form a side part application coating;

irradiating the side part application coating with a laser light for an alignment mark to form an alignment mark;

detecting film meandering by using the alignment mark; and adjusting the position of the mask.

For example, the exposure material coating and/or the side part application coating is formed on the film base material, which has been wound on a supply reel, the exposure material coating and/or the side part application coating being formed before irradiation with the laser light for an alignment mark while the film base material is moved from the supply reel to a take-up reel.

In the film exposure method as in the present invention, for example, the mask is arranged on an upstream side and a downstream side in the direction of movement of the film, and is adapted for exposing a pattern of the upstream mask and of the downstream mask on the exposure material coating respectively on the upstream side and the downstream side in the direction of movement of the film, the alignment mark being formed on the side part application coating at a position corresponding to the position of the upstream mask in the direction of movement of the film and the alignment mark being detected at a position corresponding to the position of the downstream mask in the direction of movement of the film, whereby film meandering occurring before the film has moved to an exposure region created by the downstream mask from an exposure region created by the upstream mask is detected and the relative position of the downstream mask with respect to the film is corrected by an amount commensurate with a deviation caused by the film meandering.

Effects of the Invention

The present invention is a film exposure method for exposing with a mask pattern a film on which an exposure material coating has been formed in a exposure pattern formation region on a film base material, wherein a film where a colored firing material, a colored light-curable material, or a colored ink has been applied to at least one of two side edges of the film base material in the width direction to form a side part application coating is supplied and the side part application coating is irradiated with a laser light to form an alignment mark. The colored side part application coating is highly absorptive to laser light, and the alignment mark is easy to form.

Even in a case where the side part application is removed by irradiation with the laser light for an alignment mark to form the alignment mark, the colored application coating remains in the periphery of the alignment mark, and thus the alignment mark can be distinctly and accurately detected. Thus, according to the present invention, film meandering can be accurately detected and the mask positions can be accurately adjusted, and the film can be stably exposed.

BEST MODE FOR CARRYING OUT THE INVENTION

Figure 1:
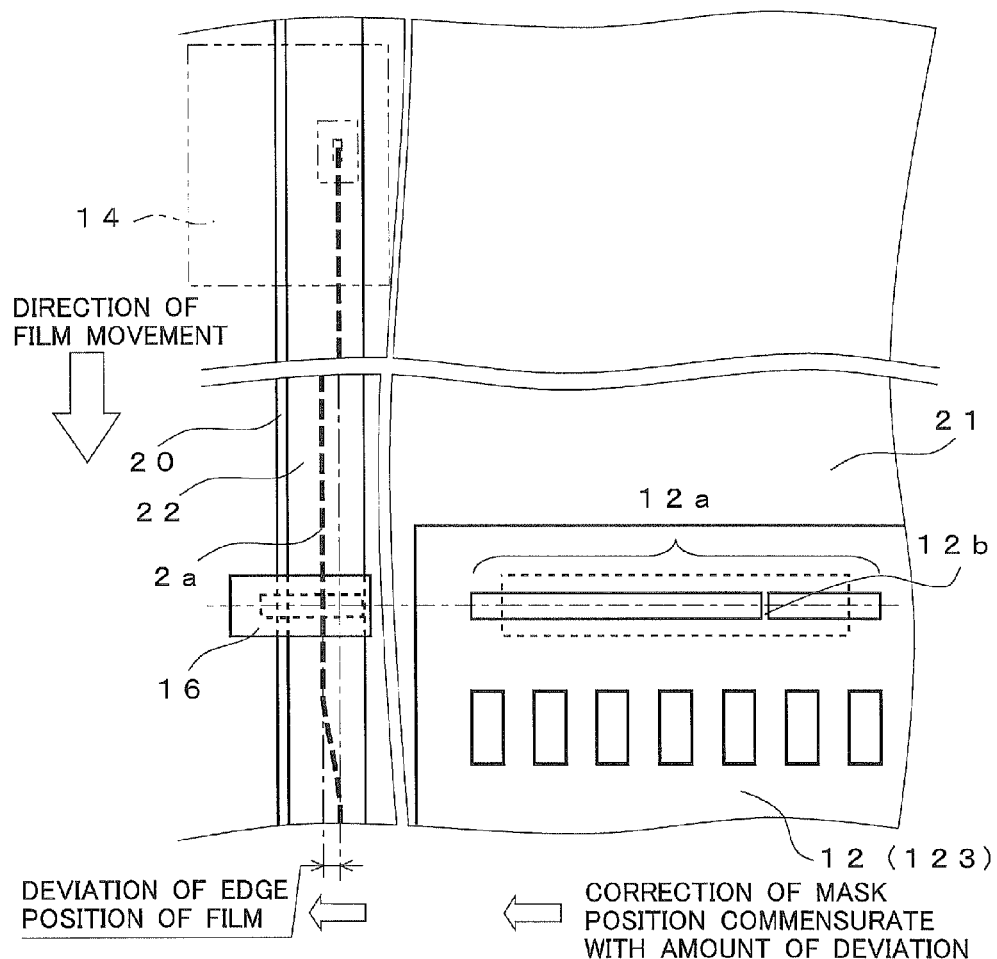
FIG. 1 is a drawing illustrating a correction for deviation in the width direction of a film by using an alignment mark, in an exposure apparatus for exposing a film as in an embodiment of the present invention.
Figure 2:
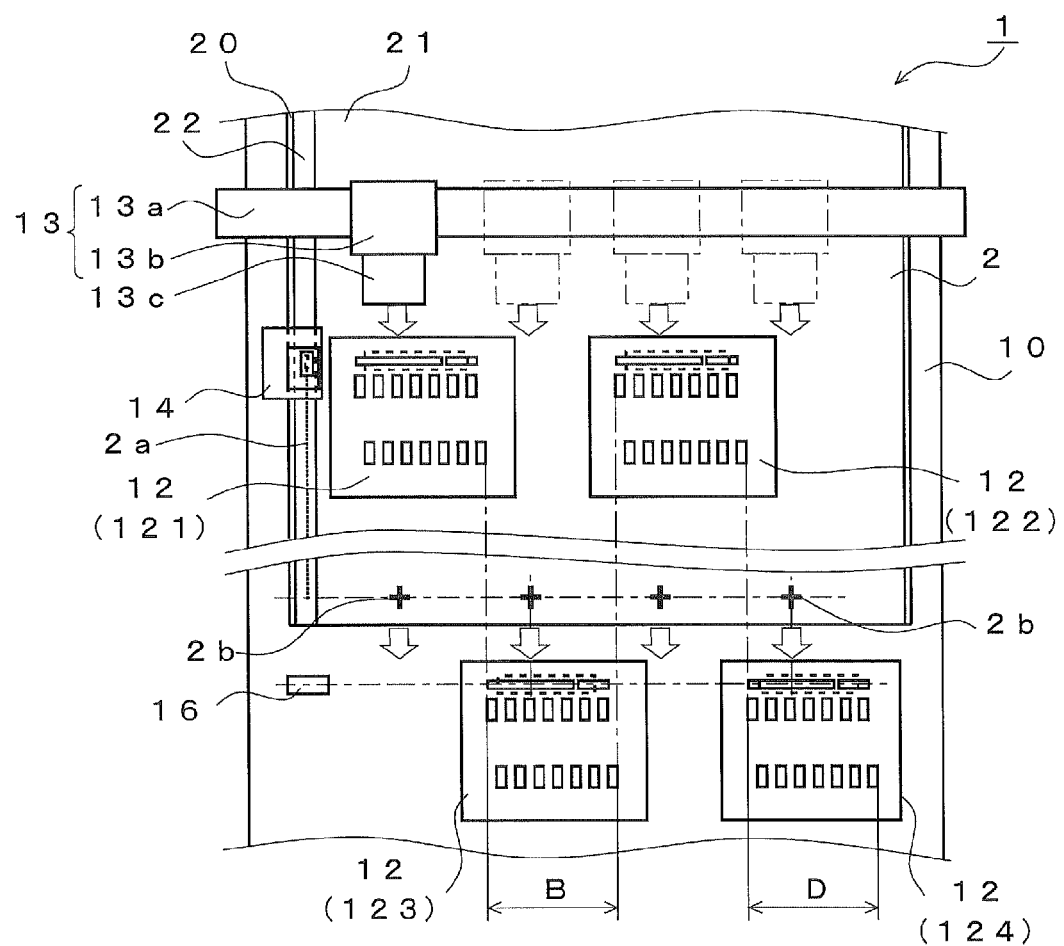
FIG. 2 is a drawing illustrating the movement of a draw-in mark caused by conveying the film in an exposure apparatus for exposing a film as in an embodiment of the present invention.
Figure 3:
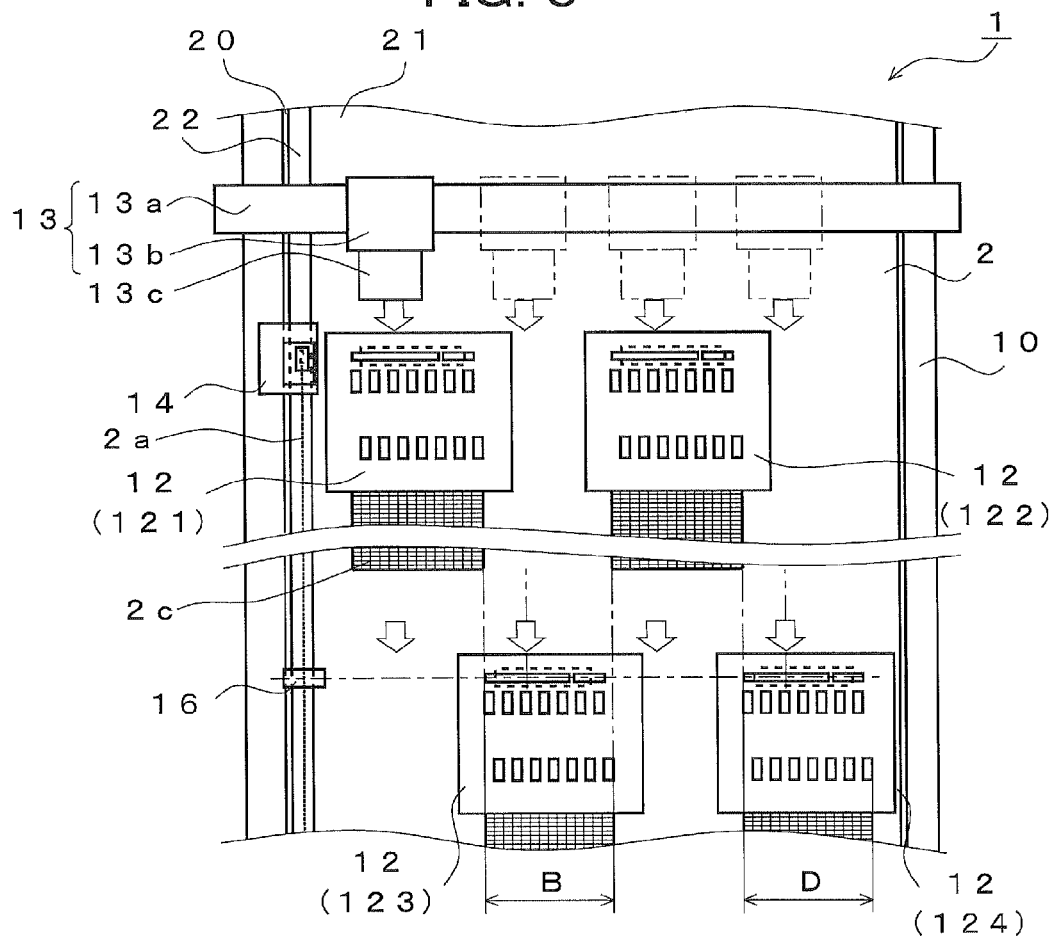
FIG. 3 is a drawing illustrating the relative positional relationship between a pattern created by an upstream mask and a pattern created by a downstream mask in an exposure apparatus for exposing a film as in an embodiment of the present invention.
Figure 10:
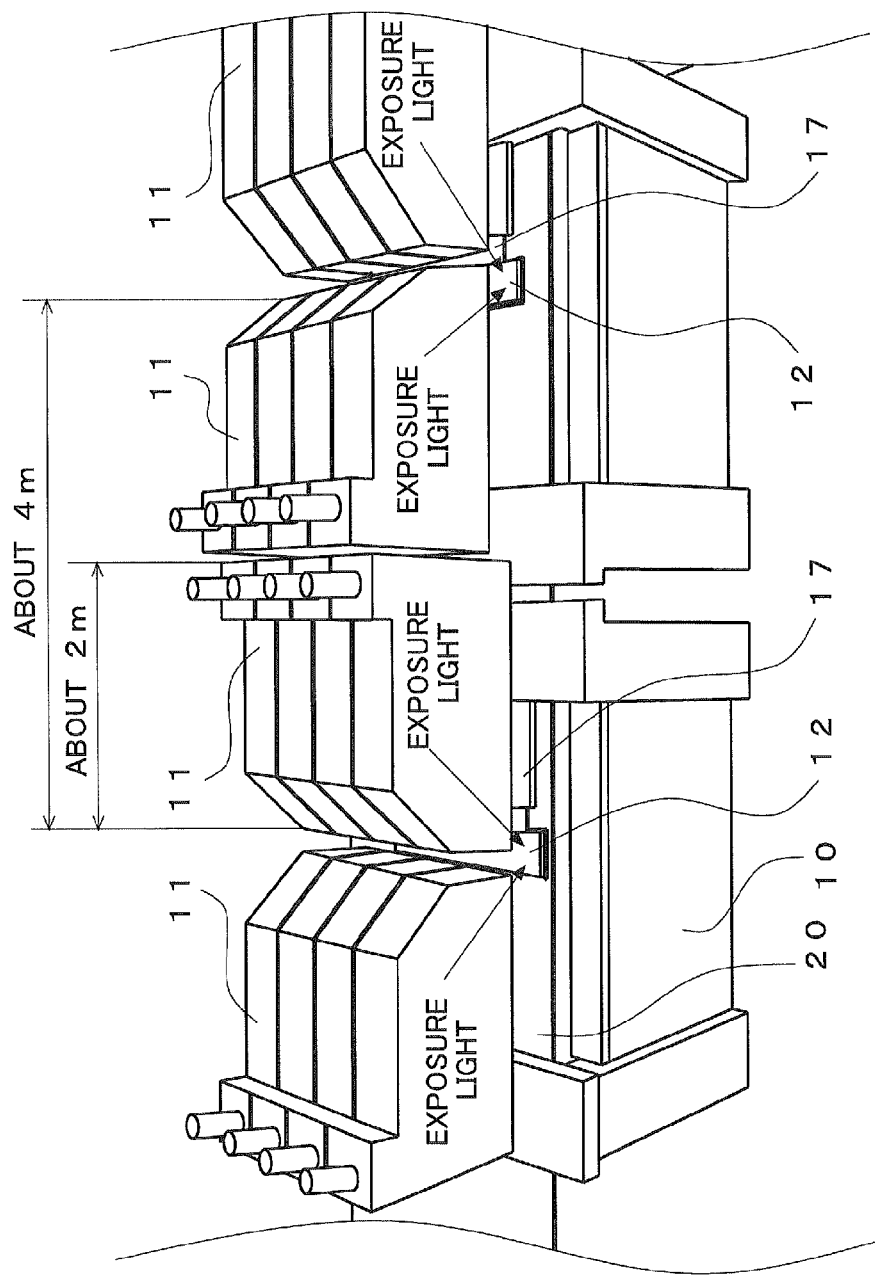
FIG. 10 is a perspective view illustrating by way of example an exposure apparatus of a segmented orientation format.
Figure 11:
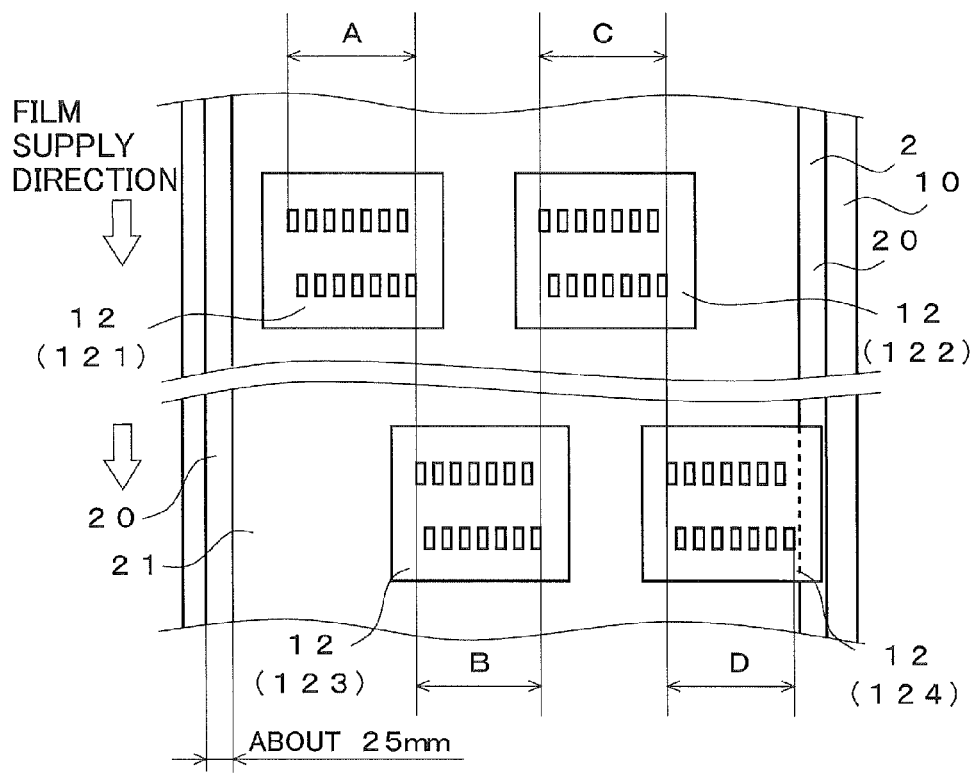
FIG. 11 is a drawing illustrating by way of example an exposure apparatus of a configuration where a plurality of light sources is arranged in a movement direction of a film.

The following describes in greater detail an embodiment of the present invention, with reference to the accompanying drawings. First, the configuration of an exposure apparatus for exposing a film as in an embodiment of the present invention shall be described. FIG. 1 is a drawing illustrating a correction for deviation in the width direction of a film by using an alignment mark, in an exposure apparatus for exposing a film as in an embodiment of the present invention; FIG. 2 is a drawing illustrating the movement of a draw-in mark caused by conveying the film in an exposure apparatus for exposing a film as in an embodiment of the present invention; and FIG. 3 is a drawing illustrating the relative positional relationship between a pattern created by an upstream mask and a pattern created by a downstream mask in an exposure apparatus for exposing a film as in an embodiment of the present invention. An exposure apparatus 1 as in the present embodiment, similarly with respect to the conventional exposure apparatus illustrated in FIGS. 10 and 11, has exposure light sources 11 for emitting an exposure light, masks 12, an optical system for irradiating a film 2 via the masks 12 with the exposure light emitted from the exposure light sources 11, and a film conveyor unit such as, for example, a conveyor roller, for conveying the film 2; the film 2 is irradiated via the masks 12 with the exposure light emitted from the exposure light sources 11 by an optical system of, for example, a collimator lens and/or a reflecting mirror or the like, to expose an exposure material coating 21 formed on a film base material 20 in a region in the widthwise middle of the film.

The exposure apparatus 1, as illustrated in FIGS. 1 to 3, has a laser marker for alignment 14 (a laser light source for an alignment mark) for forming an alignment mark 2a on a side part of the film 2. In the present invention, the film 2 is supplied to the exposure apparatus 1 with a colored firing material, a colored light-curable material, or a colored ink having been applied onto at least one of two side edges to form a side part application coating 22. That is, as performed in the past, the film 2 has the exposure material coating 21 formed in a region for forming an oriented coating on the film base material 20 (an exposure pattern formation region in the present invention), as shown FIG. 1. The exposure material coating 21 is, for example, colorless and translucent. Thus, a colored firing material, a colored light-curable material, or a colored ink is applied onto a side part of the film base material 20 where conventionally an exposure material would not be applied, thus forming the side part application coating 22. The side part application coating 22 is irradiated with a laser light from the laser marker for alignment 14 and the alignment mark 2a is formed by the heat imparted by the irradiation with laser light or the exposure.

Figure 4:
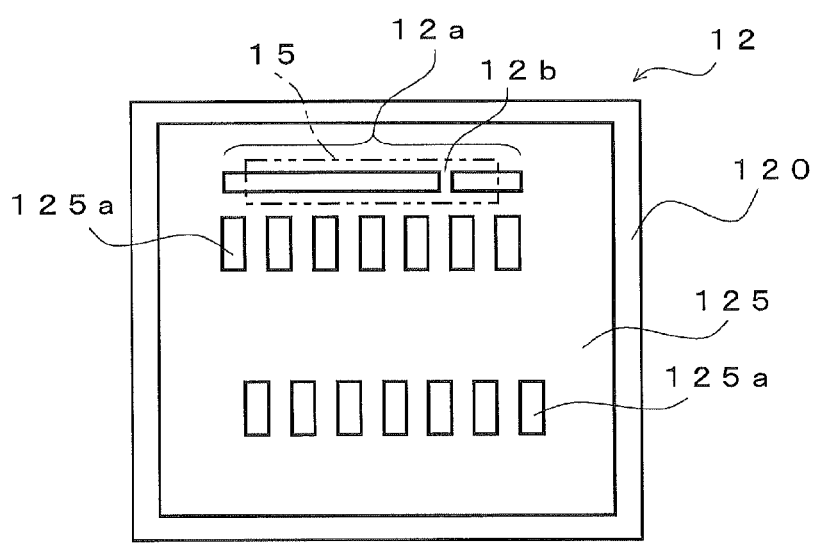
FIG. 4 is a plan view illustrating a mask in an exposure apparatus for exposing a film as in an embodiment of the present invention.

In the present embodiment, the exposure apparatus 1 has, for example, a laser marker 13 (a draw-in mark formation unit) arranged in proximity to a film supply unit such as a conveyor roller, as well as, for example, a line CCD 15 (a film pull-in position detection unit) arranged so as to extend in the width direction of the film 2, for example, below the masks 12, as illustrated in FIGS. 2 to 4. The exposure apparatus is thereby adapted to be able to adjust the positions of the masks 12 with respect to the film 2, by forming a draw-in mark 2b, serving as a reference for positioning the masks 12, by using the laser marker 13 on the film 2 being supplied from the film supply unit, and detecting the draw-in mark 2b by using the line CCD 15.

Figure 9:
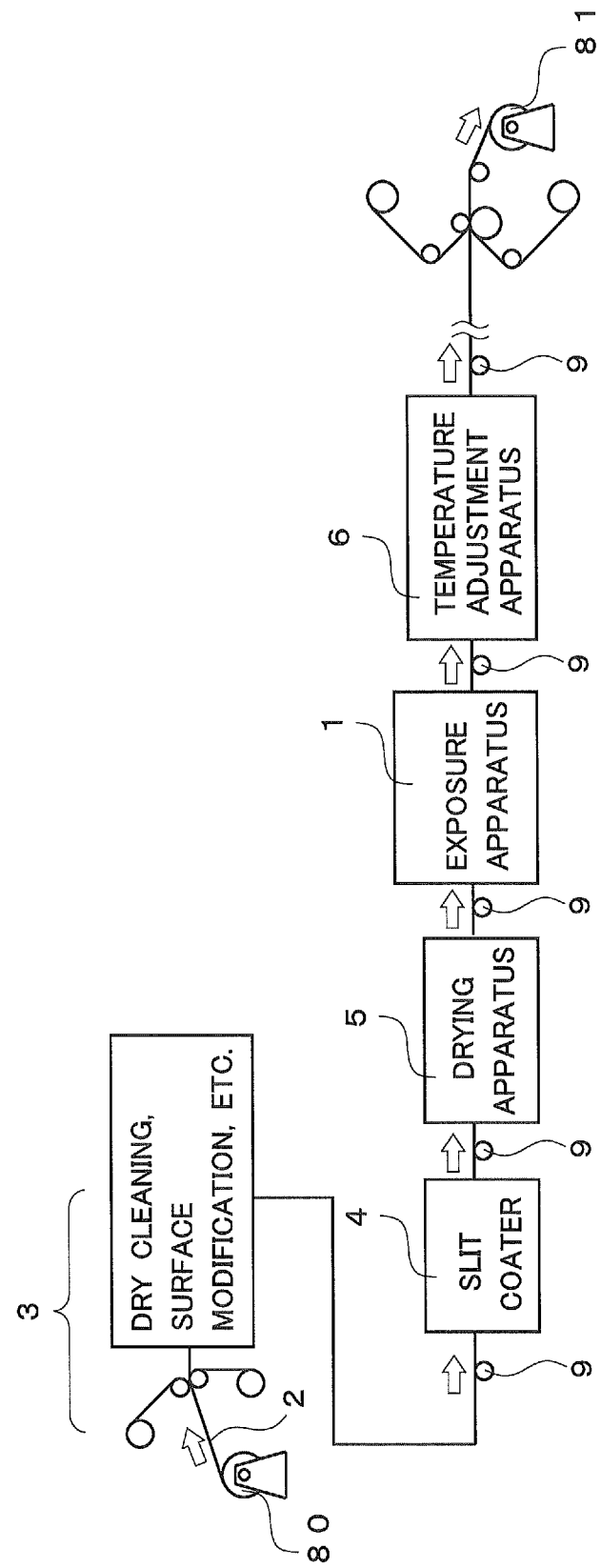
FIG. 9 is a drawing illustrating one example of a film production line of a roll-to-roll format.

As illustrated by, for example, FIG. 9, the base material 20 of the film 2 to be exposed is unwound from a supply reel 80 of a roll-to-roll format to supply the film 2 to a slit coater 4, and a coating of a predetermined material is applied to the surface by the slit coater 4. In the present embodiment, in addition to applying the exposure material to the middle of the film base material 20, the slit coater 4 is adapted, for example, to be able to apply the colored firing material or the colored light-curable material to at least one of two side edges of the film base material 20. That is, the slit coater 4 is adapted to be able to apply, for example, a colorless translucent exposure material that will become an oriented material coating (the exposure material coating 21) to the widthwise middle of the film base material 20, and to apply a liquid or paste of the colored firing material or light-curable material that will become the side part application coating 22 for alignment mark formation on a side part of the film base material 20. In such a case, the exposure material and the colored firing material or colored light-curable material may be applied by a single slit coater 4, or may separately applied by two respective slit coaters 4. A colored material that can form a firing coating on the film base material 20 by being fired (baked), e.g., a commonly used red, green, blue, and/or black resist material for an optical color filter can be suitably used as a firing material serving as the side part application coating 22. However, the side part application coating in the present invention is to be used only to form the alignment marks for detecting film meandering, and therefore a step such as developing is not especially required in a case where the side part application coating is formed of a resist material. It would also be possible to use, for example, a colored light-curable resin as the light-curing material.

Alternatively, in a case where a colored ink is used as the material for the side part application coating 22 and the ink is applied to the side part of the film base material, the slit coater 4 applies only the exposure material to the middle of the film base material 20. The colored ink is applied to the side part of the film base material 20 by an application apparatus provided on the upstream side or downstream side of the slit coater 4 in the direction of movement of the film 2, i.e., further upstream than the drying apparatus 5. A liquid or a paste of an ink in general containing a pigment and/or dye or the like can be used as the colored ink; an ink where a solvent component can be volatilized by the drying apparatus 5 to form a colored coating, e.g., an oil-based ink can be suitably used. The application apparatus used should be, for example, adapted to apply a coating of ink by causing the ink to permeate an application unit formed of an adequately flexible substance, e.g., a felt-like fiber or the like, and bringing the application unit into contact with a region of the side part of the fed film base material 20 where the exposure material is not applied.

The predetermined material having been applied thereonto by either the slit coater 4 alone or the slit coater 4 and the application apparatus, the film 2 is supplied to the drying apparatus 5. The exposure material applied to the middle of the film and the material serving as the application coating on the film side part are fired (baked), dried (the solvent component volatilized), and/or light-cured, depending on the properties of each of the materials, thus forming the exposure material coating 21 and the side part application coating 22, respectively, on the film base material 20. The film 2 is supplied into the exposure apparatus 1 by the conveyor roller or other conveyance apparatus. In the present invention, similarly with respect to convention, an oriented coating oriented in a predetermined direction by the optical orientation of the exposure material coating 21 in the widthwise middle of the film 2 supplied into the exposure apparatus 1 is formed on the film, laser light is irradiated from the laser marker for alignment 14, and the alignment mark 2a is formed on the side part application coating 22 of the film 2 by the heat imparted by the irradiation with the laser light or the exposure. The region where the side part application coating 22 is formed is a region that is, for example, 25 mm or less, e.g., 10 mm from, for example, the edge of the film, and is a region where conventionally the film base material 20 has been exposed without a material coating or the like having been formed thereon. In the present invention, the alignment mark 2a formed on the side part application coating 22 is used to detect meandering of the film 2 and adjust the positions of the masks 12. The present embodiment describes a case where a colored oil-based ink is applied as the material for the side part application coating 22 and the solvent component thereof is lost by drying (volatilization), thereby forming a coating made of ink.

The exposure light sources 11, in an exposure apparatus of, for example, a segmented orientation format, are a light source for emitting ultraviolet light, and are, for example, a mercury lamp, a xenon lamp, an excimer lamp, and an ultraviolet light-emitting diode (LED) or the like; a light source for emitting continuous light or pulsed laser light is used. In the present embodiment, an optical system of, for example, a collimator lens and/or a reflecting mirror or the like is arranged on an optical path of the exposure light emitted from the exposure light sources 11; for example, the configuration is such that the oriented material coating (the exposure material coating 21) formed on the region for pattern formation on the exposure material coating on the film 2 is irradiated with the exposure light at a predetermined quantity of light. The exposure light sources 11 are adapted to allow for the direction of emission of exposure light to be adjusted by, for example, a control apparatus (not shown), thereby making it possible to adjust the angle of incidence of the exposure light on the film 2. In the exposure apparatus 1 of the present embodiment, two exposure light sources 11 are arranged face-to-face for every one exposure region, so as to be side by side in the direction of movement of the film 2. The oriented material coating (exposure material coating 21) is thereby irradiated via the masks 12 with two exposure lights each of different pretilt angles emitted from each of the exposure light sources 11, and the oriented material coating is exposed segmented in the width direction perpendicular to the movement direction thereof to form, on the film base material 20, oriented coatings where the orientation directions are mutually different in adjacent segmented regions. When, for example, a voltage is applied to a display apparatus in which an oriented coating where a region that will serve as one picture element is segmented into two in the width direction thereof is used and a liquid crystal is sandwiched between oriented coatings, then this causes the orientation of the liquid crystal molecules when the voltage is applied to become two directions within the one picture element, in accordance with the orientation directions of the oriented coatings, and makes it possible to broaden the angle of view of the liquid crystal display or the like. It would also be possible for a film where oriented coatings of different orientation directions are formed in regions that will serve as pixels adjacent to each other in the width direction to be used as a polarizing film in, for example, a three-dimensional (3D) display or the like. The exposure light sources 11 are not limited to being two in number for one exposure region; three or more may be provided, and, for example, the oriented coating material may be oriented in three or more directions by exposure light coming from mutually different directions. Further, one exposure light source 11 may be provided for one exposure region, the configuration then being such that the exposure light emitted from the exposure light source 11 is segmented into two or more by a polarizing plate or the like for irradiation with the segmented exposure lights from mutually different directions. For example, it would be possible to segment the exposure light by using a polarizing plate into a linearly polarized exposure light of P polarization and a linearly polarized exposure light of S polarization, and to irradiate from different respective directions.

In the present embodiment, there is a plurality of the masks 12, arranged on the upstream side and downstream side in the direction of movement of the film 2 and spaced apart from each other; as illustrated in, for example, FIGS. 2 and 3, the masks are provided as one pair on the upstream side (masks 121, 122) and one pair on the downstream side (masks 123, 124). The plurality of masks 12 is arranged so that exposure regions created by the upstream masks 121, 122 and exposure regions created by the downstream masks 123, 124 are adjacent to each other along the direction of movement of the film, i.e., are arranged in a staggered fashion; one pair of the exposure light sources 11 is provided for each of the masks 12. As illustrated in FIG. 3, the exposure light coming from the exposure light sources 11 is transmitted through the masks 121 and 122 on the upstream side in the direction of movement of the film 2, to expose the oriented coating material on the film 2 in exposure regions A and C. The exposure light coming from the exposure light sources 11 is also transmitted through the downstream masks 123 and 124 to expose the oriented coating material on the film 2 in exposure regions B and D.

In the present embodiment, the masks 12 are constituted of, for example, a frame body 120 and a pattern formation unit 125 in the middle thereof, as illustrated in FIG. 4; patterns 125a of a predetermined light transmission region are formed in the pattern formation unit 125. That is, either openings through which the exposure light is transmitted are formed or light-transmissive members are installed on the pattern formation unit 125 so as to correspond to the pattern shape formed on the film 2. In the exposure apparatus of, for example, the segmented orientation format, the oriented material coating on the surface of the film 2, having been arranged on a stage 10, is exposed by the light transmitted through the pattern formation unit 125. In the present embodiment, one pair of exposure light sources 11 is arranged for each of the masks 12, and exposure lights of respectively different angles of incidence are emitted. As such, in the present embodiment, the patterns 125a correspond to the two exposure lights of different angles of incidence, and respective pluralities of rectangular opening patterns are provided so as to be side by side in two rows on the upstream side and downstream side in the direction of movement of the film. The light transmission region groups on the upstream side and the downstream side are formed spaced apart from each other so that irradiation regions for the exposure light do not overlap with each other. The upstream pattern and the downstream pattern are formed staggered along the width direction thereof so that, for example, the exposure regions created by the upstream pattern and the downstream pattern are adjacent to each other.

In the present embodiment, a viewing window 12a for line CCD, about 300 μm in width and about 250 mm in length, is provided to the masks 12 further upstream (on FIG. 4) than the patterns 125a so as to extend in the width direction perpendicular with respect to the direction of movement of the film 2; a line-shaped light-blocking pattern 12b, for example, about 15 μm in width for blocking the exposure light is provided midway in the viewing window 12a in the lengthwise direction. The position of the light-blocking pattern 12b is detected by a line CCD 15 (described below), and is used to position the masks 12. The positions and shapes of the viewing window 12a and the light-blocking pattern 12b in the present embodiment are however one example, and the present invention is not limited by these positions and shapes, provided that accurate positioning of the masks 12 can be carried out. For example, the positions of the viewing window 12a and the light-blocking pattern 12b may be provided to a region between the patterns 125a formed so as to be side by side in two rows, or the like; for example, instead of the light-blocking pattern 12b, a plurality of slits that intersect each other (for example, in the shape of an "N") may be provided.

Each of the masks 12 is supported at, for example, the portion of the frame body 120 by a mask stage 17, and is adapted so that the entirety of the masks 12 can be moved by moving the mask stages 17. The mask stages 17 are connected to a mask position control unit 30 as illustrated in, for example, FIG. 5, and is adapted so that the control by the mask position control unit 30 makes it possible to move in, for example, a horizontal direction (the width direction of the film, or the width direction of the film and the length direction of the film). This makes it possible to horizontally adjust the position where the film 2 is exposed through the masks 12. The mask stages 17 can also move, for example, in a vertical direction, and are adapted so that this enables adjustment so that the, for example, oriented coating material on the film 2 is exposed at a predetermined size.

A film conveyor unit is, for example, a conveyor roller 9 or the like, provided to, for example, the outside of the exposure apparatus 1 and the inside of the exposure apparatus 1, and is driven by a motor or the like, rotates and thereby conveys the film 2, having been unwound from the supply reel 80, toward the inside of the exposure apparatus 1, and moves the film 2 having been exposed inside the exposure apparatus 1 to a take-up reel 81.

The laser marker for alignment 14 (light source for the alignment mark) either is a laser light source for exposing by irradiating the side part application coating 22 with exposure light, or is a laser light source for subjecting the side part application coating 22 to marking by the heat imparted by irradiation with laser light, and is a laser light source for irradiating with, for example, an Nd:YAG laser, ultraviolet light, or the like, e.g., a xenon flash lamp or the like. In a case where the laser marker for alignment 14 is a pulse light source, the side part application coating 22 formed at the side part of the film 2 is irradiated with the exposure light and subjected to marking by the heat imparted by irradiation with laser light or exposure, the movement of the film 2 causing the marking to be formed so as to extend linearly, thus forming the alignment mark 2a at a width of 10 to 50 μm and a length of 150 μm to 50 mm (particularly preferably, a width of about 20 μm and a length of about 300 μm) on the side part application coating 22 at regular intervals. Alternatively, in a case where the laser marker for alignment 14 is a light source for emitting continuous light, the alignment mark 2a is formed continuously so as to extend in the direction of movement of the film 2 on the side part application coating 22. The present embodiment describes a case where a pulsed laser light source is used as the laser marker for alignment 14. By being irradiated with laser light, the ink of the side part application coating 22 is subjected to marking by the heat imparted by the irradiation with laser light, but the film 2 is not affected such as by being modified. In the present embodiment, the laser marker for alignment 14 is provided, for example, so as to be side by side in the width direction of the film with respect to the masks 121, 122 on the upstream side in the direction of movement of the film 2, and forms the alignment mark 2a on the side part application coating 22 at a position corresponding to the viewing windows 12a (and the light-blocking patterns 12b) of the masks 121, 122 on the upstream side in the direction of movement of the film 2. In the present embodiment, the region for forming the alignment mark 2a is, for example, a region within 25 mm from the edge of the film, and is a portion where conventionally the film base material 20 has been exposed without a material coating or the like having been formed thereon. Forming the alignment mark 2a at the edge of the film corresponding to the positions of the viewing windows 12a of the upstream masks 121, 122 causes the distance between the patterns formed in the region A and in the region C on the upstream side in the direction of movement of the film 2 and the alignment mark 2a at the edge of the film 2 to always be a constant interval.

In the present embodiment, the alignment mark 2a formed on the side part application coating 22 of the film at a position corresponding to the positions of the masks 121, 122 on the upstream side in the direction of movement of the film 2 is used to detect the meandering of the film 2. That is, an alignment mark detection unit 16 is arranged above or below the film 2 so as to be side by side in the width direction of the film 2 with the downstream masks 123, 124, at a position corresponding to the position of the masks 123, 124 on the downstream side in the direction of movement of the film 2, and is adapted to detect the position of the alignment mark 2a at a position corresponding to the positions of the downstream masks 123, 124. The alignment mark detection unit 16 is, for example, a CCD camera, and detects the position of the alignment mark 2a in the film width direction at, for example, a position corresponding to the viewing windows 12a of the downstream masks 123, 124. For example, in a case where the film 2 has meandered in the width direction thereof while moving, the alignment mark 2a will also deviate in association therewith in the width direction of the film 2, by an amount commensurate with the amount of meandering thereby, but the alignment mark detection unit 16 detects the position of the alignment mark 2a having deviated in the width direction due to the meandering.

Figure 5:
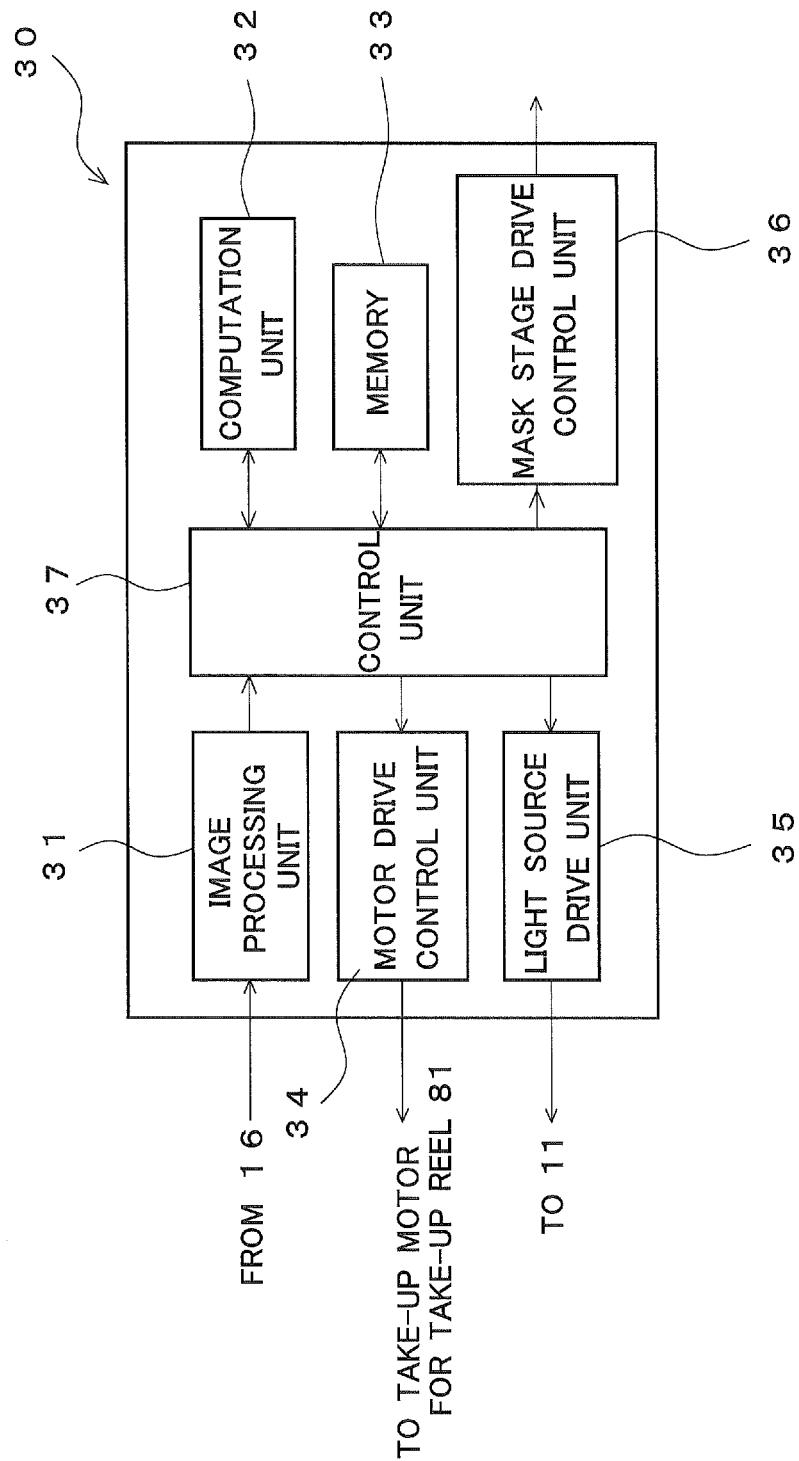
FIG. 5 is a drawing illustrating by way of example a control unit for a mask position.

The alignment mark detection unit 16 is connected to the mask position control unit 30, as illustrated in, for example, FIG. 5. The detected position of the alignment mark 2a in the film width direction is sent to the mask position control unit 30. The mask position control unit 30 is adapted to adjust the positions of the masks 123 and 124 on the downstream side in the direction of movement of the film on the basis of the position of the alignment mark 2a sent from the alignment mark detection unit 16. That is, by forming the alignment mark 2a and using same to detect the meandering of the film 2, the exposure apparatus 1 as in the present embodiment is able to adjust the position of the downstream marks 123, 124 by the detected amount of meandering.

FIG. 5 is a drawing illustrating the configuration of the mask position control unit 30 by way of example. As illustrated in FIG. 5, the mask position control unit 30 is connected, for example, to a mask stage drive unit, the exposure light sources 11, and a motor provided to the film take-up reel 81 (see FIG. 9). As illustrated in FIG. 5, the mask position control unit 30 is provided with an image processing unit 31, a computation unit 32, a memory 33, a motor drive control unit 34, a light source drive unit 35, a mask stage drive control unit 36, and a control unit 37.

The image processing unit 31 is adapted for carrying out image processing of the alignment mark 2a imaged by the alignment mark detection unit 16 (a CCD camera), and detecting, for example, a center position of the alignment mark 2a in the film width direction. The computation unit 32 computes, for example, the deviation in the width direction of the film between a center position of the alignment mark 2a that should be set and the actual center position of the alignment mark 2a. The computation unit 32 also computes the deviation in the film width direction between the positions of the masks 12 that should be set for the start of exposure and the actual positions of the masks 12, by the distance between the position of the draw-in marks 2b as detected by a line CCD 15 (described below) and the positions of the light-blocking patterns 12b on the masks 12. The memory 33 stores, for example, the center position of the alignment mark 2a detected by the image processing unit 31 and the amount of deviation computed by the computation unit 32. The motor drive control unit 34 controls, for example, the driving or stopping of the motor of the film take-up reel 81, or the rotational speed of when the motor is being driven.

The light source drive unit 35 is adapted for controlling the turning on and off and output of the exposure light sources 11, or the oscillation frequency thereof. The mask stage drive control unit 36 is adapted for controlling the driving of the mask stages 17, and controls, for example, the movement direction of and amount of movement by the mask stages 17. The control unit 37 controls the driving of the image processing unit 31, the computation unit 32, the memory 33, the motor drive control unit 34, the light source drive unit 35, and the mask stage drive control unit 36. The for film exposure apparatus 1 is thereby adapted, for example, to adjust the positions of the masks 12, perform on/off switching of irradiation of the exposure light by the exposure light sources 11, or be capable of controlling the rotational speed of the motor provided to the take-up reel 81 for taking up the film 2.

Thus, in the present embodiment, in a case where the position of the alignment mark 2a has deviated outwardly in the width direction of the film, as illustrated in, for example, FIG. 1, the mask position control unit 30 computes the amount of deviation thereby, and moves the positions of the downstream masks 123 and 124 outwardly in the width direction of the film by an amount commensurate with the deviation of the alignment mark 2a. In a case where the position of the alignment mark 2a has deviated inwardly in the width direction of the film, too, the mask position control unit 30 computes the amount of deviation thereby and moves the positions of the downstream masks 123 and 124 inwardly in the width direction of the film by an amount commensurate with the deviation by the alignment mark 2a.

Figure 6:
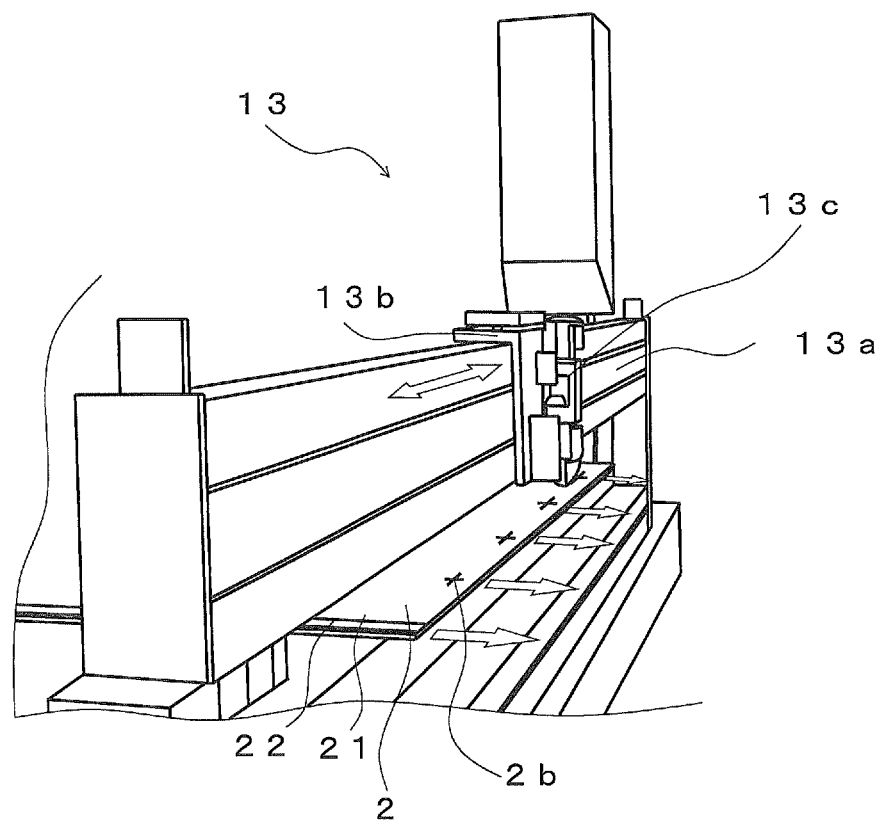
FIG. 6 is a drawing illustrating by way of example a draw-in mark formation unit.

The laser marker 13, as illustrated in FIG. 6, is constituted of a gantry stage 13a, a conveyor unit 13b, and a marking unit 13c; the gantry stage 13a is arranged so as to extend in the film width direction perpendicular to the direction of movement of the film, above the portion where the film is being supplied. The conveyor unit 13b is supported by the gantry stage 13a and is adapted to be able to move on the gantry stage 13a along the length direction thereof. The position of the conveyor unit 13b is controlled by a control apparatus (not shown), and this makes it possible to adjust the position of the marking unit 13c.

Figure 7:
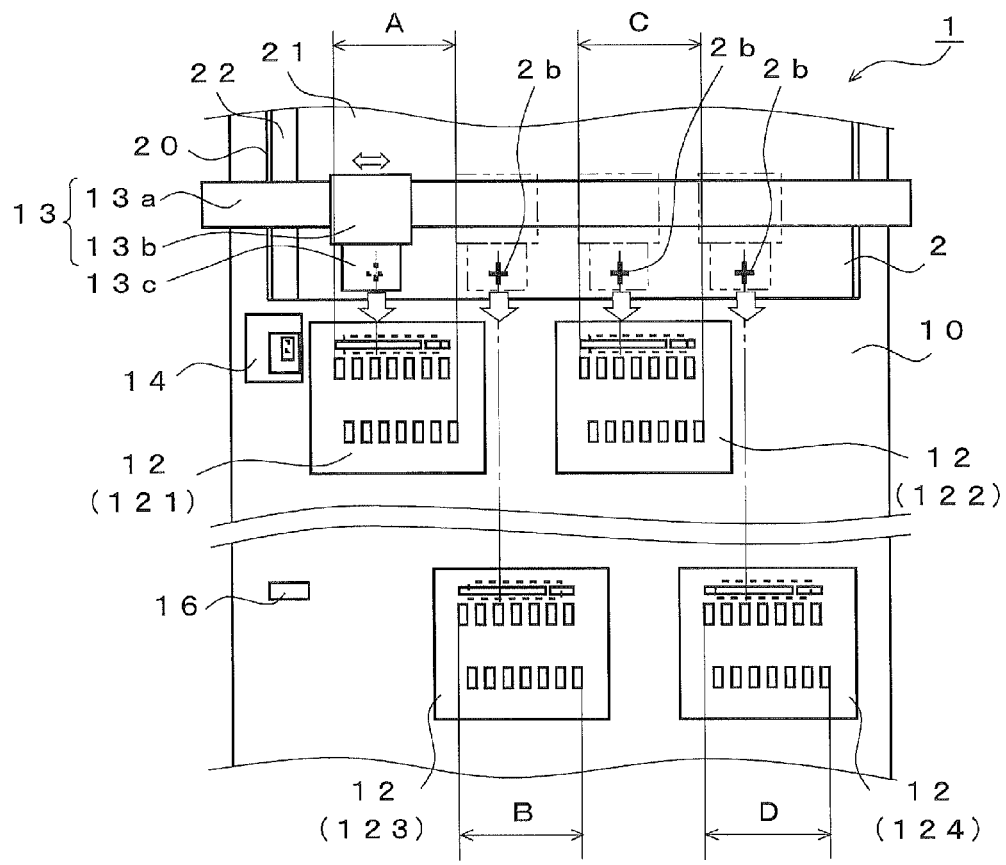
FIG. 7 is a drawing illustrating an exposure step using an upstream mask in an exposure apparatus for exposing a film as in an embodiment of the present invention.

The marking unit 13c emits a laser light from a laser light such as, for example, an Nd:YAG laser and, as illustrated in FIG. 6, is adapted for forming the draw-in marks 2b in a predetermined shape, e.g., a cruciform shape, at a leading end of the film 2 being supplied from the film supply unit. The marking unit 13c is fixed to the conveyor unit 13b, and is adapted so that control of the position of the conveyor unit 13b by a control apparatus makes it possible to adjust the formation positions of the draw-in marks 2b on the film 2. In the present embodiment, as illustrated in FIG. 7, the marking unit 13c is adapted to form four draw-in marks 2b at, for example, constant intervals on the leading end of the film 2 so as to correspond to each of the four masks 12.

Figure 8:
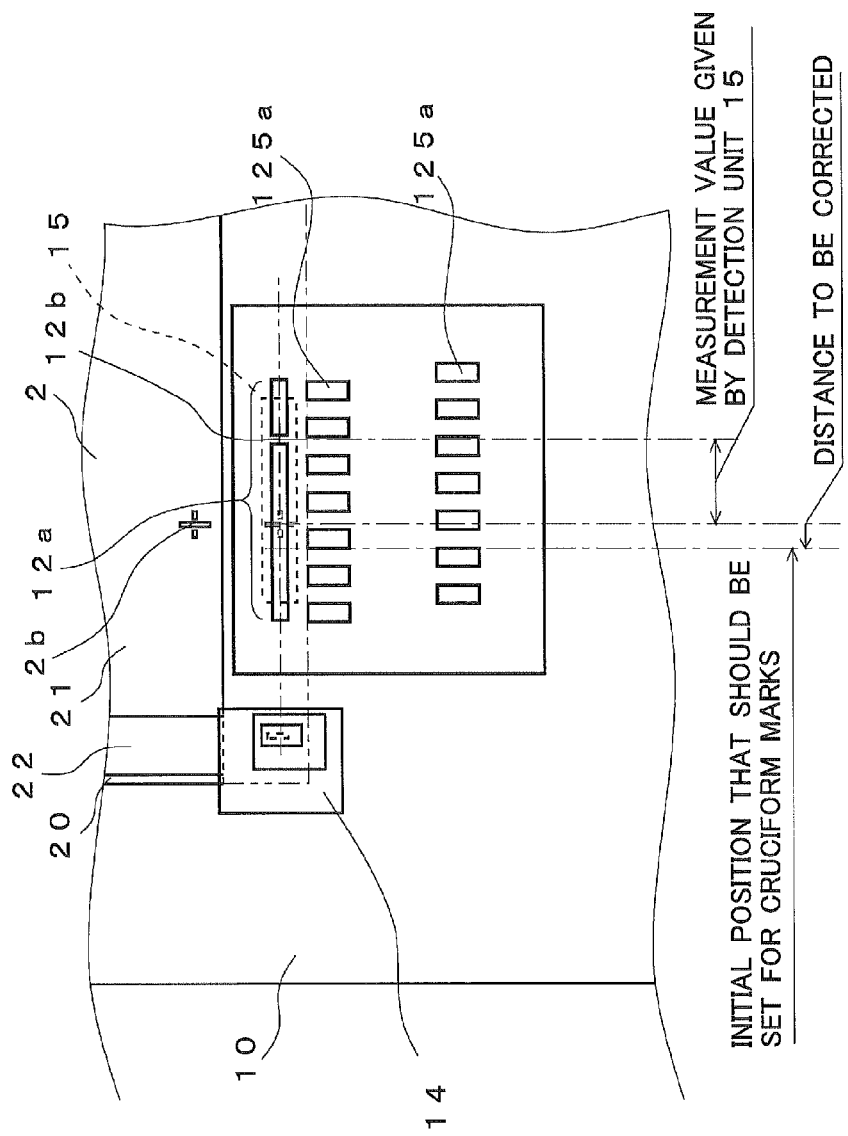
FIG. 8 is a drawing illustrating correcting a mask position by using a draw-in mark in an exposure apparatus for exposing a film as in an embodiment of the present invention.

As illustrated in FIG. 8, the line CCD 15 (a film pull-in position detection unit) is arranged so as to extend in the width direction of the film below the viewing windows 12a and the light-blocking patterns 12b provided to each of the masks 12, and detects the positions of the draw-in marks 2b formed at the leading end of the film 2 when the leading end of the film 2 has been conveyed so far as to be positioned above the line CCD 15 (between the line CCD 15 and the masks 12). The line CCD 15 detects the light-blocking patterns 12b provided midway in the viewing windows 12a of the masks 12 as being the actual position of the masks 12. The line CCD 15 is connected to the mask position control unit 30, and is adapted to send to the mask position control unit 30 the detected positions of the draw-in marks 2b and the light-blocking patterns 12b.

The mask position control unit 30 also adjusts the positions of the masks 12 when exposure is carried out on the film for the first time, by the distance between the two in a plane parallel to the film surface as computed from the positions of the draw-in marks 2b and the light-blocking patterns 12b having been sent from the line CCD 15. That is, the mask position control unit 30 stores in advance data on the positions of the masks (the light-blocking patterns 12b) that should be set, using the positions of the draw-in marks 2b as a reference, and, as illustrated in FIG. 8, the mask position control unit 30 uses the positions of the draw-in marks 2b detected by the line CCD 15 as reference positions and moves the positions of the mask stages 17 until the mask positions as determined by the detected positions of the light-blocking patterns 12b reach predetermined positions. This makes it possible, with the exposure apparatus of the present embodiment, to adjust the positions of the masks 12 using as a reference the positions of the draw-in marks 2b formed in advance at high accuracy on the film 2, even at the start of exposure, and makes it possible to determine at high accuracy the positions at which the film should be exposed.

In the present embodiment, the film 2 being supplied to the exposure apparatus 1 has the side part application coating 22 formed at the side part where conventionally the film base material 20 has been exposed without a material coating or the like having been formed thereon. The side part application coating 22 is formed when a colored oil-based ink is applied by the application apparatus and thereafter the solvent component is lost by volatilization by the drying apparatus 5 or the like. The side part application coating 22, having been formed of a colored ink, a resist material for a color filter, or the like, has an absorptivity of 90 to 98% to laser light when irradiated with, for example, a laser light of a wavelength of 532 nm, an extremely high absorptivity in comparison to those of the film base material and the oriented coating material (the absorptivity of the film base material and the oriented coating material to the laser light are both substantially 0%), and is readily marked by exposure or laser processing by being irradiated with the laser light coming from the laser marker for alignment 14. Accordingly, marking by laser light is easier than a case where a colorless, translucent film base material is marked by being irradiated with laser light, and the alignment mark 2a is readily formed. In a case where, for example, the film base material 20 is being marked, it is difficult to form the alignment mark 2a without an extremely high irradiation energy for the laser light, e.g., 8 J/cm$^2$, in a case where, for example, the laser light being used is ultraviolet light at a wavelength of 266 nm. In a case where the oriented material coating is being laser-marked, the irradiation energy of the laser light can be reduced in comparison to the case of only the film base material 20, but because the oriented material coating around the alignment mark 2a is also colorless and translucent, it is necessary to use an expensive, large-sized detection apparatus such as, for example, a scanning electron microscope (SEM), and a problem emerges in that the costs of the exposure apparatus increase and so does the scale. However, in a case where the side part application coating 22 is formed of a colored ink, as in the present embodiment, the laser light can be given a lower irradiation energy, to about 0.6 J/cm$^2$, in a case where, for example, the laser light being used is ultraviolet light of a wavelength of 532 nm. Also, in a case where, for example, the side part application coating 22 is formed of a resist material for a color filter, the laser light can be given a lower irradiation energy, to about 1.0 J/cm$^2$. Accordingly, forming the side part application coating 22 of a colored material as described above makes it easier to mark by laser light and, because the colored application coating remains around the alignment mark 2a thus formed, the alignment mark 2a thus formed can be readily and accurately detected even in a case where an inexpensive, small-sized detection apparatus such as a CCD camera is used. As such, the accurately formed alignment mark 2a makes it possible to detect the meandering of the film 2 and to accurately adjust the positions of the masks 12, so the film can be stably exposed.

Also, forming the draw-in marks 2b at the leading end of the film 2 and adjusting the positions of the masks 12 depending on the positions of the draw-in marks 2b prevents undulation or widthwise deviation of the film 2 from causing exposure regions to overlap or to be left unexposed in a case where the exposure regions are divided into an upstream side and a downstream side in the present embodiment. Also, because the initial positions of the masks 12 are determined using the draw-in marks 2b formed at the leading end of the film 2 as a reference, not only the upstream patterns but also the downstream patterns can be formed accurately. This makes it possible to stably expose the film.

It would also be possible to simplify the configuration of the exposure apparatus by, for example, using the same laser light for both the laser light sources 11 for emitting the exposure light and the laser marker 14 for forming the alignment mark 2a.

In the present embodiment, the initial positions of the masks 12 at the start of exposure are adjusted by forming the draw-in marks 2b at the leading end of the film and detecting same with the line CCD 15, but this configuration need not be provided in the present invention.

The following describes the operation of the present embodiment during film exposure. First, the film 2, before being supplied to the exposure apparatus 1, receives an application of the exposure material serving as the oriented coating (the exposure material coating 21) at the middle of the film base material 20, by the slit coater 4 illustrated in FIG. 9. The colored ink is applied to at least one of the two side edges of the film base material (a region as far as 25 mm from the edge) by the application apparatus, which is provided on either the upstream side or downstream side of the slit coater 4 (on the upstream side of the drying apparatus 5) in the direction of movement of the film. In the application of the ink, the application unit formed of, for example, a felt-like fiber or the like, having been permeated with the ink, is brought into contact with the surface of the film base material 20, whereby a coating of the ink is applied to the surface of the film base material 20. A coating of the liquid or paste of exposure material and colored ink is thereby applied to the surface of the film base material 20.

Next, the film 2 is conveyed to the drying apparatus 5, and the liquid or paste of exposure material and colored application coating material (ink) on the surface are dried (solvent component volatilized), light-cured, and/or fired (baked), depending on the properties of each of the materials. The exposure material coating 21 (oriented material coating) and the side part application coating 22 are thereby formed on the surface of the film base material 20. That is, the predetermined oriented material coating is formed at the widthwise middle of the film base material 20, while a coating of ink from which the solvent component has been volatilized is formed as the side part application coating 22 for alignment mark formation at the side part as far as 25 mm from the edge of the film base material 20. These two types of coatings having been formed thereon, the film 2 is supplied into the exposure apparatus 1 from the leading end thereof by, for example, the conveyor roller 9. Having been supplied into the exposure apparatus 1, the film 2 is supplied from the leading end to below the laser marker 13 by, for example, the conveyor roller or other film supply unit.

Once the leading end of the film 2 has been supplied to below the laser marker 13, the film 2 momentarily stops being supplied by, for example, the conveyor roller or other conveying apparatus. The control by the control apparatus causes the conveyor unit 13b of the laser marker 13 to be moved on the gantry stage 13a, whereby the marking unit 13c is conveyed to a predetermined position. The marking unit 13c is thereby arranged at, for example, any of the positions on the upstream side of the viewing windows 12a provided to each of the four masks 12.

Once the position of the marking unit 13c has been defined, the laser light is emitted from the marking unit 13c to form the, for example, cruciform draw-in marks 2b on the leading end of the film 2. Because the film 2 will then be supported by the conveyor roller or the like on the film supply unit side, the draw-in marks 2b can be accurately formed without the leading end of the film 2 vibrating or undulating. Once one of the draw-in marks 2b has been completely formed, the control apparatus moves the marking unit 13c by, for example, moving the conveyor unit 13b on the gantry stage 13a, and thereafter similarly irradiates with the laser light to form the draw-in mark 2b on the leading end of the film. Then, as illustrated in FIG. 7, once the formation of the four draw-in marks 2b on the leading end of the film has ended, the operation of the laser marker 13 is stopped and the film 2 is again conveyed by the conveyor roller or the like.

The leading end of the film 2, by being conveyed by the conveyor roller or the like, arrives below the masks 12 arranged so as to correspond to the exposure regions A and C (masks 121, 122), as shown in FIG. 8. The line CCD 15 is arranged at a position corresponding to the viewing windows 12a (and the light-blocking pattern 12b) below each of the masks 12, so as to extend in the width direction of the film 2, and the line CCD 15 detects the positions of the draw-in marks 2b when the draw-in marks 2b are conveyed to the point of being positioned above the line CCD 15. The line CCD 15 also detects the positions of the light-blocking patterns 12b provided midway in the viewing windows 12a of the masks 12. The distance between the draw-in marks 2b and the light-blocking patterns 12b of the masks 12 is thereby measured. The line CCD 15 sends to the mask position control unit 30 a signal of the detected distance between the draw-in marks 2b and the light-blocking patterns 12b. However, the film 2 stops being conveyed from the step for detection by the line CCD 15 until when the adjustment of the mask positions is completed.

Once the signal of the distance between the draw-in marks 2b and the light-blocking patterns 12b has been inputted from the line CCD 15, the mask position control unit 30 first compares the distance between the two in a plane parallel to the film surface against the previously stored data (data on the initial positions that should be set for the masks 12 using the positions of the draw-in marks 2b as a reference). The mask stages 17 are moved until the mask positions as determined by the positions by the light-blocking patterns 12b reach the predetermined initial positions. The film 2 thereby serves as a reference for accurately determining the initial positions of the masks 12 (the masks 121, 122) before the start of exposure at the exposure regions A and C.

Once the initial positions of the upstream masks 121, 122 have been determined, the side part application coating 22 formed at the side part of the film 2 with laser light from the laser marker for alignment 14 begins to be irradiated and the region irradiated with the laser light either is marked by the exposure or by the heat imparted by the irradiation with the laser light. During this time, in some instances regarding the side part application coating 22, the ink may have been removed in the region irradiated with the laser light, exposing the film base material 20 in the marking region. However, in the present embodiment, the irradiation energy of the laser light is low, and the film base material is not modified or otherwise affected. A case where the irradiation energy of the laser light is greater still is not problematic, because although the colorless, translucent film base material 20 may suffer some damage, the region where the side part application coating 22 is formed is a region not used for the image display region in a display apparatus.

The side part application coating comprising a colored ink, formed on the film side part, has a much higher absorptivity to laser light than the absorptivity to light of the film base material and the oriented coating material. The ink in the irradiation region is accordingly readily marked by the heat imparted by the irradiation with the laser light even in a case where the irradiation energy of the laser light irradiated from the laser marker for alignment 14 is as small as, for example, about 0.6 J/cm$^2$. It is accordingly easier to form the alignment mark 2a than when the colorless, translucent film base material is irradiated with and marked by the laser light, and because the application coating remaining at the periphery is also colored, the alignment mark 2a can be distinctly and accurately formed.

In the present embodiment, the position of the laser marker for alignment 14 is a position corresponding to the viewing windows 12a (and light-blocking patterns 12b) of the masks 12 that are upstream in the direction of movement of the film 2 (the masks 121, 122). The alignment mark 2a is accordingly formed on the side part application coating 22 so that the relative distance to the masks 121, 122 that are upstream in the direction of movement of the film 2 is constant.

Once the formation of the alignment mark 2a has been started, the film 2 is conveyed by the conveyor roller or the like without exposure having been started. In so doing, as illustrated in FIG. 2, the leading end of the film 2, by being conveyed, arrives below the masks 12 arranged so as to correspond to the downstream exposure regions B and D (the masks 123, 124). Similarly with respect to an upstream case, the line CCD 15 is arranged so as to extend in the width direction of the film 2 at a position corresponding to the viewing windows 12a (and the light-blocking patterns 12b) of each of the masks 12, and the line CCD 15 detects the positions of the draw-in marks 2b formed at the leading end of the film 2 when the leading end of the film 2 has been conveyed so far as to be positioned above the line CCD 15 (between the line CCD 15 and the masks 12). Also, similarly with respect to the case of the upstream side, the line CCD 15 detects the light-blocking patterns 12b, provided midway in the viewing windows 12a of the masks 12, as the actual positions of the masks 12, and thereby measures the distance between the draw-in marks 2b and the light-blocking patterns 12b of the masks 12. The signal of the detected distance between the draw-in marks 2b and the light-blocking patterns 12b is then sent to the mask position control unit 30. However, for example, the film 2 stops being conveyed after the step for detection by the line CCD 15 provided so as to correspond to the positions of the downstream masks 12, until the adjustment of the downstream mask positions is completed. During this time, the formation of the alignment mark 2a may also be temporarily stopped.

Once the signal of the distance between the draw-in marks 2b and the light-blocking patterns 12b of the downstream masks 12 (123, 124) is inputted from the line CCD 15, the mask position control unit 30 compares the distance between the two in a plane parallel to the film surface against previously stored data (data on the initial positions that should be set for the masks 12, using the positions of the draw-in marks 2b as a reference). The mask stages 17 are then moved to adjust the positions of the downstream masks 12 (123, 124) until the mask positions, which are determined by the positions of the light-blocking patterns 12b, reach the predetermined initial positions. The initial positions of the downstream masks 12 (the masks 123, 124) are thereby accurately determined using the film 2 as a reference prior to the start of exposure in the exposure regions B and D.

The film 2 is again conveyed by the conveyor roller or the like once, as per the foregoing, the initial positions of the upstream masks 121, 122 and the downstream masks 123, 124 are determined. The film 2 is then conveyed until sites to be exposed are positioned in the regions to be irradiated by the exposure light having been transmitted through each of the masks 12, where the exposure light from the exposure light sources 11 is transmitted through the masks 12 to start the exposure of the film 2. The oriented coating material on the film 2 (the exposure material coating 21) is thereby oriented in predetermined directions so as to correspond to the angles of irradiation of the exposure light. The oriented material coating on the film is continuously irradiated with the exposure light emitted from the exposure light sources 11 while the film 2 is also being supplied by the conveyor roller or the like, thus continuously exposing the sites to be exposed. Thereby, patterns 2c corresponding to the upstream masks 121, 122 are formed on the film 2 at the exposure regions A and C, and patterns 2c corresponding to the downstream masks 123, 124 are formed at the exposure regions B and D; each of the patterns 2c is formed as illustrated in FIG. 3 in a strip shape along the direction of conveyance of the film 2. The positions of each of the masks 12 at the start of exposure have been adjusted by the draw-in marks 2b formed at a constant position with respect to the film 2. As such, the positions of the two upstream masks 121, 122 and the positions of the two downstream masks 123, 124 are accurately set in terms of the relative positions with respect to the film, and each of the mask positions is set so that, for example, the patterns 2c imparted by the upstream masks 121, 122 and the patterns 2c imparted by the downstream masks 123, 124 are adjacent to each other without overlapping and without any gap being formed therebetween.

The conveying eventually causes the patterns 2c formed in the exposure regions A and C to approach positions corresponding to the downstream masks 123, 124. However, the positions of the masks 12 that are downstream in the direction of movement of the film (123, 124) are spaced apart about 4 m from the positions of the upstream masks 12 (121, 122), and as such, while the film is being continuously exposed, meandering of the film 2 may result in deviation of the film 2 in the width direction thereof with respect to the masks 12 on the downstream side in the direction of movement of the film. The patterns 2c formed by the upstream masks 121, 122 may accordingly also deviate in the direction of meandering by the film 2, and be supplied to the exposure regions B, D imparted by the downstream masks 123, 124.

However, in the present embodiment, the CCD camera or other alignment mark detection unit 16 has been provided to a position corresponding to the viewing windows 12a (and light-blocking patterns 12b) of the masks 12 that are downstream in the direction of movement of the film 2 (the masks 123, 124), and a coating made of colored ink has been formed as the side part application coating 22 in a predetermined region from the edge of the film 2; the alignment mark 2a has been formed distinctly and highly accurately in this side part application coating 22. The alignment mark 2a is formed so that the relative position in the width direction perpendicular to the direction of movement of the film with respect to the upstream masks 121, 122 is constant. Accordingly, the alignment mark 2a is detected at a position corresponding to the downstream masks 123, 124, and the positions of the downstream masks 123, 124 are adjusted so that the distance between the alignment mark 2a and the downstream masks 123, 124 reaches a constant interval on the downstream side in the direction of movement of the film 2. That is, as illustrated in FIG. 1, in a case where, for example, the position of the alignment mark 2a has deviated outwardly in the width direction of the film, the mask position control unit 30 moves the positions of the downstream masks 123, 124 outwardly in the width direction of the film by an amount commensurate with the deviation by the alignment mark 2a. Conversely, in a case where the position of the alignment mark 2a has deviated inwardly in the width direction of the film, the mask position control unit 30 moves the positions of the downstream masks 123, 124 inwardly in the width direction of the film by an amount commensurate with the deviation by the alignment mark 2a. This manner of adjusting the positions of the downstream masks 123 124 using the alignment mark 2a as a reference in the present embodiment makes it possible to accurately adjust the exposure regions imparted by the downstream masks with respect to the patterns 2c formed by the upstream masks.

In the present embodiment, the application coating made of colored ink is formed in the periphery of the alignment mark 2a used to adjust the mask positions, and the alignment mark 2a can be distinctly and accurately detected even in a case where an inexpensive and small-sized detection apparatus such as a CCD camera is used. As such, in the present embodiment, the meandering of the film 2 can be detected at high accuracy without the use of a large, expensive detection apparatus to detect the alignment mark 2a. Accordingly, in the present embodiment, correcting the positions of the masks 12 that are downstream in the direction of movement of the film 2 (123, 124) makes it possible to expose the film stably, without deviation in the exposure positions of the film 2, even in a case where the film 2 has deviated in the width direction thereof as illustrated in FIG. 1 during continuous exposure. This allows the pattern exposed by the exposure region B to fill in between the patterns formed by the exposure regions A and C on the film 2, and allows the pattern imparted by the exposure region D to be formed so as to be adjacent to the pattern formed by the exposure region C. The patterns already formed by the exposure regions A and C and the patterns formed by the exposure regions B and D can thus accurately form a patterning over the full surface of the film without any overlap occurring or any unexposed portions being left.

The present embodiment describes a case where the exposure material coating 21 and the side part application coating 22 are formed on the surface of the film base material 20 while the film base material 20, wound by the supply reel 80, is moved to the take-up reel 81, and where the film 2 having the two types of material coating formed thereon is supplied to the exposure apparatus; however, the exposure material coating 21 and the side part application coating 22 may also be formed on a line different from the line of the exposure apparatus. For example, the exposure coating material 21 and/or the side part application coating 22 is formed on the surface of the film base material 20 on another roll-to-roll line, and the film is then temporarily taken up by a take-up reel. In a case where either the exposure material coating 21 or the side part application coating 22 has been formed on the film base material 20, the formation of the other material coating is carried out either on the same line as the exposure apparatus or on yet another roll-to-roll line. The roll of film 2 on which the material coatings have been formed is then mounted onto the supply reel 80 on the line of the exposure apparatus 1 and the film 2 having the two types of material coating formed thereon is supplied to the exposure apparatus 1.

Also, the present embodiment describes a case where the laser marker 14 for forming the alignment mark 2a is provided to a position corresponding to the masks 121, 122 that are upstream in the film movement direction, but the laser marker for alignment 14 may also be provided, for example, further upstream in the film movement direction than the upstream masks 121, 122. In such a case, a new alignment mark detection unit 16 should be provided so as to be side by side with the upstream masks 121, 122 in the width direction of the film 2 in correspondence with the positions of the masks 121, 122 that are upstream in the direction of movement of the film 2. Then, similarly with respect to the downstream side, the newly arranged alignment mark detection unit 16 should be adapted to detect the position of the alignment mark 2a at a position corresponding to the positions of the upstream masks 121, 122.

Furthermore, the present embodiment describes an exposure method using an exposure apparatus in which two masks are arranged respectively on the upstream side and on the downstream side, but the present invention is adapted to detect the meandering of the film by the formation of the alignment mark and is not limited by the number or arrangement of the masks and the like.

INDUSTRIAL APPLICABILITY

According to the present invention, a film where a colored firing material, colored light-curable material, or colored ink has been applied to at least one of two edges of a film base material in the width direction to form a side part application coating of heightened absorptivity to laser light is supplied, and the side part application coating is irradiated with laser light to form an alignment mark; thus, the alignment mark is easy to form. Accordingly, the present invention is useful for correcting for meandering of a film in an exposure apparatus for continuously exposing a film.

KEY

1: exposure apparatus
10: stage
11: exposure light source
12: mask
12a: viewing window
12b: light-blocking pattern
120: frame body
121: (first) mask
(122): second mask
123: (third) mask
124: (fourth) mask
125: pattern formation unit
125a: (mask) pattern
13: laser marker
13a: gantry stage
13b: conveyor unit
13c: marking unit
14: laser marker for alignment mark
15: film pull-in position detection unit
16: alignment mark detection unit
17: mask stage
2: film
2a: alignment mark
2b: draw-in mark
2c: pattern
20: film base material
21: exposure material coating
22: side part application coating
30: mask position control unit
31: image processing unit
32: computation unit
33: memory
34: motor drive control unit
35: light source drive unit
36: mask stage drive control unit
37: control unit

The invention claimed is:

1. A film exposure method in which an exposure material coating, which is formed in an exposure pattern formation region on a film base material of a film, is irradiated with an exposure light via a mask, whereby a pattern of said mask is exposed on said exposure material coating,
   the method comprising:
   supplying a film where a colored firing material, a colored light-curable material, or a colored ink has been applied to at least one of two widthwise side edges of said film base material to form a side part application coating;
   irradiating the side part application coating with a laser light for an alignment mark to form an alignment mark;
   detecting film meandering by using the alignment mark; and
   adjusting the position of said mask.

2. The film exposure method as set forth in claim 1, wherein said exposure material coating and/or said side part application coating is formed on said film base material, which has been wound on a supply reel, the exposure material coating and/or said side part application coating being formed before irradiation with said laser light for an alignment mark while the film base material is moved from said supply reel to a take-up reel.

3. The film exposure method as set forth in claim 1, wherein
   said mask is arranged on an upstream side and a downstream side in the direction of movement of said film, and is adapted for exposing a pattern of said upstream mask and of said downstream mask on the exposure material coating respectively on the upstream side and the downstream side in the direction of movement of said film,
   said alignment mark being formed on said side part application coating at a position corresponding to the position of said upstream mask in the direction of movement of said film and said alignment mark being detected at a position corresponding to the position of said downstream mask in the direction of movement of said film, whereby film meandering occurring before said film has moved to an exposure region created by said downstream mask from an exposure region created by said upstream mask is detected, and the relative position of said downstream mask with respect to said film is corrected by an amount commensurate with deviation caused by said film meandering.

4. The film exposure method as set forth in claim 2, wherein
   said mask is arranged on an upstream side and a downstream side in the direction of movement of said film, and is adapted for exposing a pattern of said upstream mask and of said downstream mask on the exposure material coating respectively on the upstream side and the downstream side in the direction of movement of said film,
   said alignment mark being formed on said side part application coating at a position corresponding to the position of said upstream mask in the direction of movement of said film and said alignment mark being detected at a position corresponding to the position of said downstream mask in the direction of movement of said film, whereby film meandering occurring before said film has moved to an exposure region created by said downstream mask from an exposure region created by said upstream mask is detected, and the relative position of said downstream mask with respect to said film is corrected by an amount commensurate with deviation caused by said film meandering.

* * * * *